(12) United States Patent
Okawa et al.

(10) Patent No.: US 12,366,715 B2
(45) Date of Patent: Jul. 22, 2025

(54) OPTO-ELECTRIC HYBRID BOARD

(71) Applicant: NITTO DENKO CORPORATION, Ibaraki (JP)

(72) Inventors: Tadao Okawa, Ibaraki (JP); Takashi Oda, Ibaraki (JP); Masataka Yamaji, Ibaraki (JP); Kazushi Ichikawa, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 339 days.

(21) Appl. No.: 18/010,564

(22) PCT Filed: Jul. 14, 2021

(86) PCT No.: PCT/JP2021/026405
§ 371 (c)(1),
(2) Date: Dec. 15, 2022

(87) PCT Pub. No.: WO2022/024756
PCT Pub. Date: Feb. 3, 2022

(65) Prior Publication Data
US 2023/0258893 A1    Aug. 17, 2023

(30) Foreign Application Priority Data
Jul. 29, 2020    (JP) ................. 2020-128012

(51) Int. Cl.
G02B 6/12    (2006.01)
G02B 6/42    (2006.01)
H05K 1/02    (2006.01)

(52) U.S. Cl.
CPC ......... *G02B 6/428* (2013.01); *G02B 6/12002* (2013.01); *G02B 6/12004* (2013.01);
(Continued)

(58) Field of Classification Search
CPC ............ G02B 6/12002; G02B 6/12004; G02B 6/4214; G02B 6/428; H05K 1/0245; H05K 1/0274; H05K 2201/2009
See application file for complete search history.

(56) References Cited

U.S. PATENT DOCUMENTS 5,712,749 A    1/1998  Gustafson
8,135,248 B2*  3/2012  Hodono ................ G02B 6/43
                                                430/319
(Continued)

FOREIGN PATENT DOCUMENTS

EP    3 875 931 A1    9/2021
JP    2004-363205 A   12/2004
(Continued)

OTHER PUBLICATIONS

International Search Report dated Sep. 28, 2021, issued in counterpart International Application No. PCT/JP2021/026405 (2 pages).
(Continued)

*Primary Examiner* — Ryan A Lepisto
(74) *Attorney, Agent, or Firm* — WHDA, LLP

(57) ABSTRACT

In an opto-electric hybrid board, an electric circuit part E is provided on a first surface side of an insulative layer, and includes pads for mounting an optical element, pads for a driving device for the optical element, and electrical interconnect lines Y including interconnect line portions A connecting the pads. A metal reinforcement layer and an optical waveguide W partially overlapping the metal reinforcement layer are provided on a second surface side of the insulative layer. A portion of the metal reinforcement layer which faces the interconnect line portions A on the opposite side of the insulative layer therefrom is removed to form an opening. This opto-electric hybrid board is capable of transmitting higher-frequency electric signals because the influence of
(Continued)

the metal reinforcement layer on electrical properties is suppressed.

2 Claims, 6 Drawing Sheets

(52) U.S. Cl.
CPC ......... *H05K 1/0274* (2013.01); *G02B 6/4214* (2013.01); *H05K 1/0245* (2013.01); *H05K 2201/2009* (2013.01)

(56) References Cited

U.S. PATENT DOCUMENTS

| | | | | |
|---|---|---|---|---|
| 8,135,251 | B2* | 3/2012 | Hodono | H05K 1/0274 |
| | | | | 29/829 |
| 8,142,672 | B2* | 3/2012 | Hodono | G02B 6/13 |
| | | | | 216/2 |
| 8,768,114 | B2* | 7/2014 | Tsujita | G02B 6/136 |
| | | | | 430/324 |
| 8,837,874 | B2* | 9/2014 | Tsujita | G02B 6/43 |
| | | | | 385/14 |
| 9,046,646 | B2* | 6/2015 | Tsujita | G02B 6/43 |
| 9,265,141 | B2* | 2/2016 | Inoue | G02B 6/4257 |
| 9,297,958 | B2* | 3/2016 | Tsujita | G02B 6/13 |
| 9,335,497 | B2* | 5/2016 | Tanaka | G02B 6/4204 |
| 9,618,710 | B2* | 4/2017 | Tsujita | G02B 6/4245 |
| 9,632,246 | B2* | 4/2017 | Tsujita | H05K 1/0274 |
| 9,632,263 | B2* | 4/2017 | Shibata | G02B 6/42 |
| 9,696,507 | B2* | 7/2017 | Shibata | G02B 6/42 |
| 9,703,057 | B2* | 7/2017 | Tsujita | G02B 6/428 |
| 9,851,502 | B2* | 12/2017 | Shibata | G02B 6/12 |
| 9,989,720 | B2* | 6/2018 | Tanaka | H05K 3/188 |
| 10,288,823 | B2* | 5/2019 | Tsujita | G02B 6/032 |
| 10,295,769 | B2* | 5/2019 | Tanaka | G02B 6/4281 |
| 10,353,161 | B2* | 7/2019 | Tsujita | G02B 6/13 |
| 10,606,002 | B2* | 3/2020 | Tsujita | H05K 3/0032 |
| 2004/0246626 | A1 | 12/2004 | Wakaki et al. | |
| 2011/0116737 | A1* | 5/2011 | Kim | G02B 6/4201 |
| | | | | 385/14 |
| 2017/0329093 | A1 | 11/2017 | Tanaka et al. | |

FOREIGN PATENT DOCUMENTS

| | | |
|---|---|---|
| JP | 2010-266598 A | 11/2010 |
| JP | 2011-76645 A | 4/2011 |
| JP | 2016-105160 A | 6/2016 |
| JP | 2018-146710 A | 9/2018 |
| WO | 2020/090200 A1 | 5/2020 |

OTHER PUBLICATIONS

Notification of Transmittal of Translation of the International Preliminary Report on Patentability (Form PCT/IB/338) issued in counterpart International Application No. PCT/JP2021/026405 mailed Feb. 9, 2023 with Forms PCT/IB/373 and PCT/ISA/237. (5 pages).
Office Action dated Feb. 18, 2025, issued in counterpart JP application No. 2022-540151, with English translation. (5 pages).

* cited by examiner

RELATED ART

OPTO-ELECTRIC HYBRID BOARD

TECHNICAL FIELD

The present disclosure relates to an opto-electric hybrid board for use in an optical communication module and, more particularly, to an opto-electric hybrid board excellent in reliability for high-frequency signals.

BACKGROUND ART

In recent electronic devices, optical interconnect lines have been used in addition to electrical interconnect lines with an increase in the amount of transmission information, and opto-electric hybrid boards in which the electrical and optical interconnect lines are compactly arranged have been prized. Also, the use of the aforementioned opto-electric hybrid boards for optical communication modules and the like which perform high-speed signal transmission by further connection to wiring boards and the like including a signal transmission function to various electronic devices has been expanding.

An example of such optical communication modules is schematically shown in FIG. 10. This optical communication module includes an opto-electric hybrid board 2 integrally connected to a wiring board 1. More specifically, multiple pairs of electrical interconnect lines X for differential signal transmission are provided on a surface of the wiring board 1.

The opto-electric hybrid board 2 includes an insulative layer 3 (shaded with widely spaced diagonal lines in the figure) having a wide portion and a narrow portion. An electric circuit part 6 including multiple pairs of electrical interconnect lines Y for differential signal transmission, an optical element (a VCSEL, a photodiode, or the like) 4, and an optical element driving device (an IC or the like) 5 is provided on a backside surface of the wide portion of the insulative layer 3, i.e., on a surface to be overlaid on the surface of the wiring board 1. A portion of the electric circuit part 6 where insulation is required is covered with a coverlay (not shown).

On the other hand, a metal reinforcement layer 7 for reinforcing the electric circuit part 6 is provided on the opposite surface of the insulative layer 3 from the electric circuit part 6. A strip-shaped optical waveguide 8 is provided so as to partially overlap the metal reinforcement layer 7.

The electric circuit part 6 of the opto-electric hybrid board 2 will be described in further detail with reference to FIG. 11 which schematically shows this portion on an enlarged scale (with the coverlay not shown). Specifically, pads 10 for mounting the optical element 4 (the VCSEL, the photodiode, or the like; indicated by dash-dot lines) and pads 11 for mounting the driving device 5 (the IC or the like; indicated by dash-dot lines) for driving this optical element 4 are formed in the electric circuit part 6 provided on the one surface of the insulative layer 3. The electrical interconnect lines Y including interconnect line portions A for connecting the pads 10 and 11 extend to an end edge on the opposite side from where the optical waveguide 8 extends.

The electrical interconnect lines Y include electrical interconnect line portions for connecting the optical element 4 and the driving device 5 for driving the optical element 4, and electrical interconnect line portions for connecting the driving device 5 and the electrical interconnect lines X of the wiring board 1 (with reference to FIG. 10) by means of differential electric signals. Terminals 13 serving as connection points to the electrical interconnect lines X are provided at the tips of the electrical interconnect lines Y.

The metal reinforcement layer 7 for reinforcing the electric circuit part 6 is provided on the opposite surface of the insulative layer 3 from the electric circuit part 6. The optical waveguide 8 is provided on the surface of the insulative layer 3 where this metal reinforcement layer 7 is provided so as to partially overlap the metal reinforcement layer 7.

A reflecting surface for changing the path of light (not shown) is formed in a portion of the optical waveguide 8 which faces the optical element 4 across the insulative layer 3. Light reflected from the reflecting surface is optically coupled to the optical element 4. A through hole 14 is formed in a portion of the metal reinforcement layer 7 which is sandwiched between the reflecting surface of the optical waveguide 8 and a light receiving/emitting portion of the optical element 4 so that the metal reinforcement layer 7 does not obstruct the path of light.

There has been a growing need for transmitting an enormous amount of information including image information and audio information at higher speeds and with higher accuracy in such an optical communication module. For this purpose, there have been demands for even denser electrical and optical interconnect lines and more stable transmission techniques of electric and optical signals.

For example, in a structure for connecting a suspension board with circuitry and a wiring circuit board, there has been proposed a technique such that a portion of a metal reinforcement layer provided on the wiring circuit board which overlaps terminal portions serving as connection points between the boards is previously partially opened, whereby this portion does not adversely affect the electrical properties of the connection point (see PTL 1, for example).

RELATED ART DOCUMENT

Related Patent Document

PTL 1: JP-A-2004-363205

SUMMARY

In this manner, the electrical properties at the connection points between the boards are affected by the metal reinforcement layer. For this reason, studies have been made about whether the metal reinforcement layer affects the electrical properties of the opto-electric hybrid board in other than the aforementioned connection points or not and, if so, what improvements can be made.

In view of the foregoing, the present disclosure provides an opto-electric hybrid board capable of transmitting higher-frequency electric signals while the influence of a metal reinforcement layer on electrical properties is suppressed.

The present disclosure provides the following [1] to [3].

[1] An opto-electric hybrid board for use in an optical communication module, comprising: an insulative layer; an electric circuit part provided on a first surface side of the insulative layer, the electric circuit part including a pad for mounting an optical element, a pad for an optical element driving device, and an electrical interconnect line Y including an interconnect line portion A connecting the pads; a metal reinforcement layer provided on a second surface side of the insulative layer; and an optical waveguide provided similarly on the second surface side of the insulative layer, with a portion thereof in an arrangement that partially overlaps the metal reinforcement layer, wherein a portion of the metal reinforcement layer which faces the interconnect line portion A provided on the opposite side of the insulative layer therefrom is removed to form an opening.

[2] The opto-electric hybrid board according to [1] described above, wherein the optical element is a photodiode (PD).

[3] The opto-electric hybrid board according to [1] or [2] described above, wherein an opening dimension of the opening of the metal reinforcement layer as measured in a longitudinal direction of the interconnect line portion A is set to 0.8 to 1 when a longitudinal dimension of the interconnect line portion A is 1.

The present inventors have diligently made studies about the influence of the metal reinforcement layer on electrical properties of the opto-electric hybrid board. As a result, the present inventors have found out that the effective capacitance of the optical element mounted on the opto-electric hybrid board is greater than that prior to the mounting because the capacitance generated between the metal reinforcement layer and the interconnect line portion A is added to the capacitance of the optical element itself.

The greater the effective capacitance of the optical element mounted on the opto-electric hybrid board is, the more the frequency band makes a transition to a lower frequency side than the high frequency band that the optical element exhibits prior to the mounting. From this fact, the present inventors have hit upon the idea that the elimination of the influence of the metal reinforcement layer on the effective capacitance value of the optical element mounted on the opto-electric hybrid board allows the frequency band of the optical element prior to the mounting to be maintained, thereby achieving the transmission of higher-frequency signals. As a result of further studies, the present inventors have found that, if a portion of the metal reinforcement layer which faces the interconnect line portion A connecting the pad for mounting the optical element and the pad for the optical element driving device across the insulative layer is removed, the capacitance between the interconnect line portion A and the metal reinforcement layer is removed, so that the effective capacitance of the optical element returns to a low capacitance which is the original properties of the optical element.

In the opto-electric hybrid board of the present disclosure, the portion of the metal reinforcement layer which faces the interconnect line portion A connecting the pad for mounting the optical element and the pad for the optical element driving device is removed to form the opening. This removes the capacitance between the interconnect line portion A where electricity flows and the metal reinforcement layer on the opposite side of the insulative layer therefrom, in the vicinity of the optical element to be mounted. Conventionally, the effective capacitance of the optical element mounted on the opto-electric hybrid board is increased by the amount of the capacitance between the interconnect line portion A and the metal reinforcement layer. However, the opto-electric hybrid board of the present disclosure is not subjected to such influence, so that the effective capacitance of the optical element is not increased by the mounting. Thus, the frequency band of the optical element after the mounting on the opto-electric hybrid board is maintained at the frequency band prior to the mounting of the optical element, and the amount of transmissible signal information is increased without reducing the speed.

DESCRIPTION OF EMBODIMENTS

Next, an embodiment of the present disclosure will now be described in detail with reference to the drawings. However, the present disclosure is not limited to the following embodiment.

Figure 1:
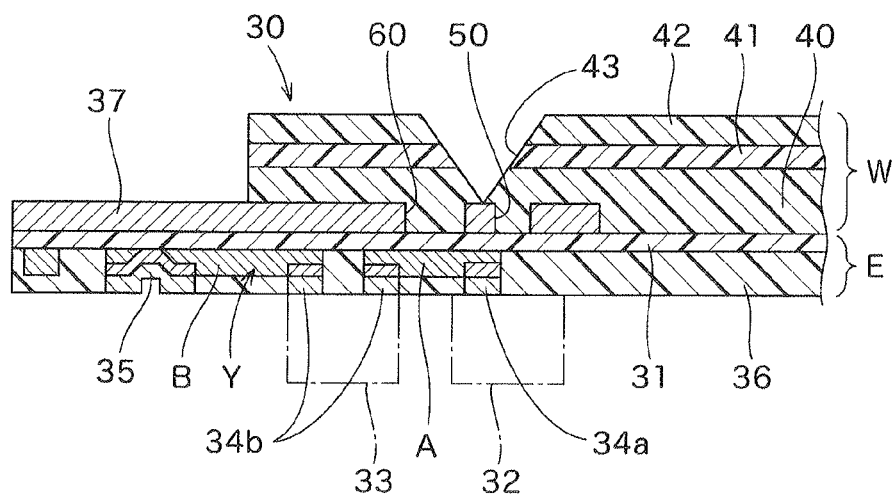
FIG. 1 is an illustration schematically showing a vertical section of principal parts of an opto-electric hybrid board according to one embodiment of the present disclosure.

FIG. 1 is an illustration schematically showing principal parts of an opto-electric hybrid board according to one embodiment of the present disclosure taken in a direction of extension of an optical waveguide.

This opto-electric hybrid board 30 is used for an optical communication module, and is identical in basic configuration with general opto-electric hybrid boards. Specifically, a single insulative layer 31 of a substantially strip-shaped configuration serves as a substrate. An electric circuit part E is provided on one surface (a first surface) of the insulative layer 31. The electric circuit part E includes multiple pairs of electrical interconnect lines Y for transmitting a differential signal, pads 34a for mounting an optical element (a PD, a VCSEL, or the like) 32, pads 34b for mounting a driving device (an IC or the like) 33 for the optical element 32, and the like (with reference to FIG. 2A). A portion of the electric circuit part E where insulation protection is required is covered with a coverlay 36. It should be noted that the optical element 32 and the driving device 33 are not attached in some cases in the stage of the opto-electric hybrid board, and are indicated by dash-dot lines.

On the other hand, a metal reinforcement layer 37 for reinforcing the strength of the insulative layer 31 is partially provided in a region where reinforcement is required on the other surface (a second surface) of the insulative layer 31, i.e., a surface on the opposite side from where the electric circuit part E is provided. An under cladding layer 40, a core 41, and an over cladding layer 42 are stacked in the order named in an arrangement that partially overlaps the metal reinforcement layer 37 on the other surface of the insulative layer 31. These three layers form an optical waveguide W (with reference to FIG. 2B). A portion of the optical waveguide W is cut into an inclined surface. The inclined surface serves as a light reflecting portion 43 for changing the direction of travel of an optical signal transmitted through the core 41 by 90 degrees.

Figure 2A:
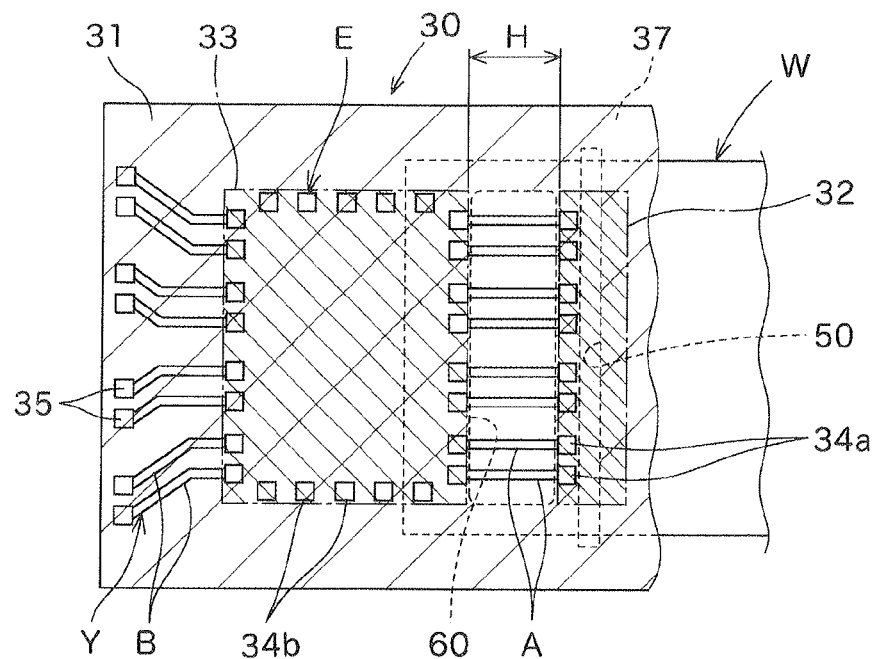
FIG. 2A is an illustration schematically showing an electric circuit part formed on the aforementioned opto-electric hybrid board as seen from the side where the electric circuit part is formed.

The electric circuit part E of the opto-electric hybrid board will be described in further detail. Specifically, the pads 34a for mounting the optical element 32 indicated by diagonal lines extending top left to bottom right and the pads 34b for mounting the driving device 33 similarly indicated by diagonal lines extending top left to bottom right are provided in the electric circuit part E, as shown in FIG. 2A in which the opto-electric hybrid board 30 is viewed from the side where the electric circuit part E is formed (with the coverlay 36 not shown). Connecting terminals 35 for connecting the opto-electric hybrid board 30 to a wiring board having the function of transmitting signals to various electronic devices are provided in an end portion of the electric circuit part E.

The electrical interconnect lines Y of the electric circuit part E include interconnect line portions A for connection between the pads 34a for the optical element 32 and the pads 34b for the driving device 33, and interconnect line portions B for connection between the pads 34b and the connecting terminals 35 for other wiring boards. Of course, other interconnect lines are also formed as needed, but are not shown.

Figure 2B:
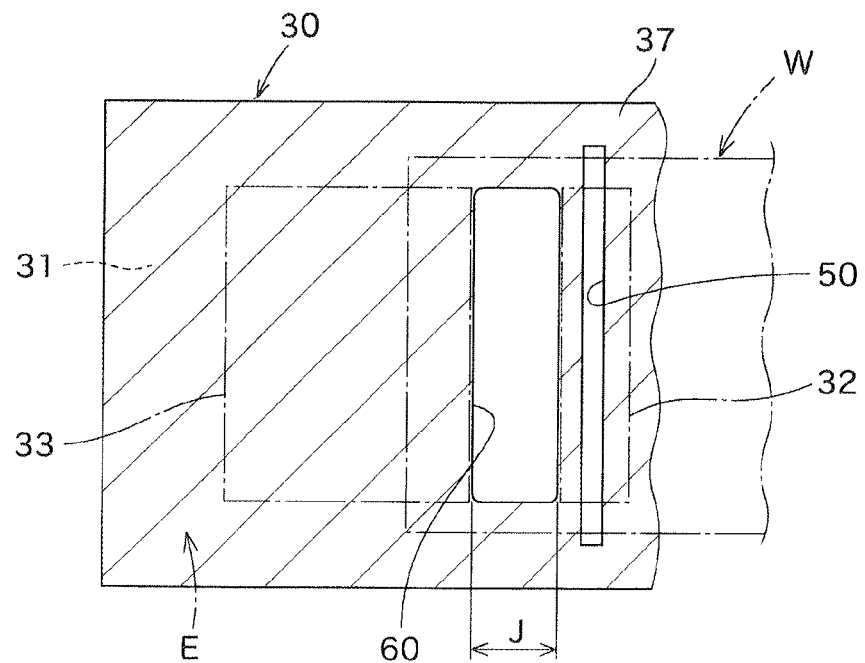
FIG. 2B is an illustration schematically showing a metal reinforcement layer formed on the aforementioned opto-electric hybrid board as seen from the side where the metal reinforcement layer is formed.

In FIG. 2A, a formation region for the metal reinforcement layer 37 provided on the surface on the opposite side of the insulative layer 31 from the electric circuit part E is indicated by diagonal lines extending from bottom left to top right. The metal reinforcement layer 37 as seen from the side where the metal reinforcement layer 37 is formed is shown in FIG. 2B. In FIG. 2B, the optical waveguide W partially overlapping the metal reinforcement layer 37 is indicated by dash-dot lines.

As may be seen from these figures, a through hole 50 for optical coupling is formed in the metal reinforcement layer 37 as in the conventional technique. In addition, a portion of the metal reinforcement layer 37 which faces the interconnect line portions A connecting the pads 34a for the optical element 32 and the pads 34b for the driving device 33, which are provided on the opposite side of the insulative layer 31 therefrom, is removed in a rectangular shape to form an opening 60. This is the most striking feature of the present disclosure. Other openings are also formed as appropriate in the metal reinforcement layer 37, but are not shown.

<Steps of Forming Opto-Electric Hybrid Board>

Next, exemplary steps of obtaining the opto-electric hybrid board 30 will be briefly described while illustrating specific materials.

(1) Formation of Electric Circuit Part E

Figure 3:
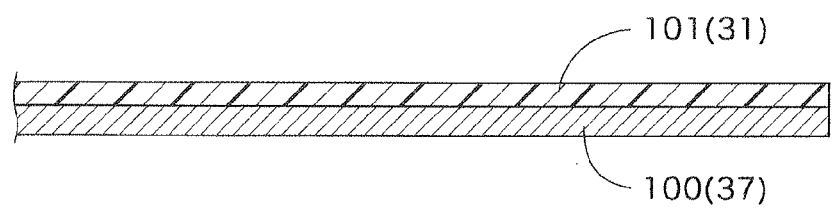
FIG. 3 is an illustration of a manufacturing step of the aforementioned opto-electric hybrid board.

First, as shown in FIG. 3, a metal plate 100 which becomes the metal reinforcement layer 37 is prepared, and a photosensitive insulating resin such as polyimide is applied to a surface of the metal plate 100 to form an insulating resin layer 101 which becomes the insulative layer 31.

Examples of the material of the metal plate 100 include stainless steel, copper, silver, aluminum, nickel, chromium, titanium, platinum, and gold. In particular, stainless steel is preferable from the viewpoint of strength, bendability, and the like. The metal reinforcement layer 37 has a thickness preferably in the range of 10 to 70 μm (more preferably in the range of 10 to 30 μm), for example.

Then, a photolithographic process (exposure, pre-bake, development, and cure) is performed on the insulating resin layer 101 to form the insulative layer 31 having a predetermined pattern shape. The insulative layer 31 has a thickness preferably in the range of 3 to 50 μm (more preferably in the range of 3 to 25 μm), for example (although this step is not shown).

Next, an electrically conductive layer made of an electrically conductive material such as copper is formed on the insulative layer 31 by sputtering, electroless plating, or the like. Thereafter, necessary processes such as dry film resist lamination, exposure, and development are performed to form an electrically conductive pattern such as the electrical interconnect lines Y including the interconnect line portions A and B, the various pads 34a and 34b, and the connecting terminals 35. Then, as shown in FIG. 4, a photosensitive insulating resin such as polyimide is applied onto the electrically conductive pattern, and the same process as the formation of the insulative layer 31 is performed, whereby the coverlay 36 is formed in the area where insulation protection is required.

Metallic materials excellent in electrical conductivity and ductility such as chromium, aluminum, gold, and tantalum in addition to copper are preferably used as the electrically conductive material for the formation of the aforementioned electrically conductive pattern. In addition, alloys of at least one of these metals are preferably used. The electrically conductive pattern such as the electrical interconnect lines Y has a thickness preferably in the range of 3 to 30 μm (more preferably in the range of 3 to 18 μm). The coverlay 36 formed on the electrically conductive pattern has a thickness preferably in the range of 1 to 50 μm (more preferably in the range of 1 to 25 μm), for example, in consideration of the insulation protection and even reinforcement of the electrical interconnect lines Y and the like.

Figure 4:
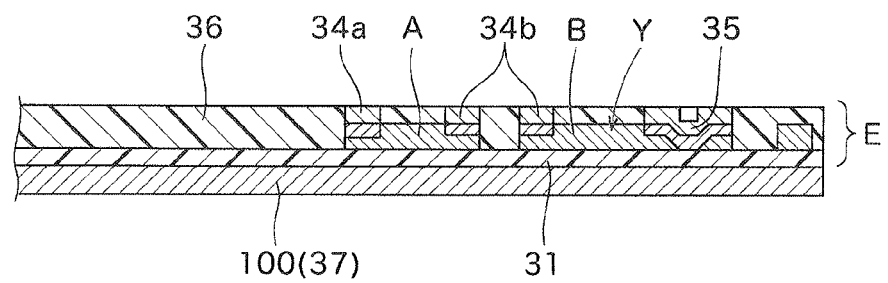
FIG. 4 is an illustration of a manufacturing step of the aforementioned opto-electric hybrid board.

Then, an electroplated layer made of nickel, gold, or the like is formed on portions which are exposed from the coverlay 36 and become the various pads 34a and 34b and the connecting terminals 35, whereby the electric circuit part E is obtained (with reference to FIG. 4).

(2) Patterning of Metal Reinforcement Layer 37

Figure 5:
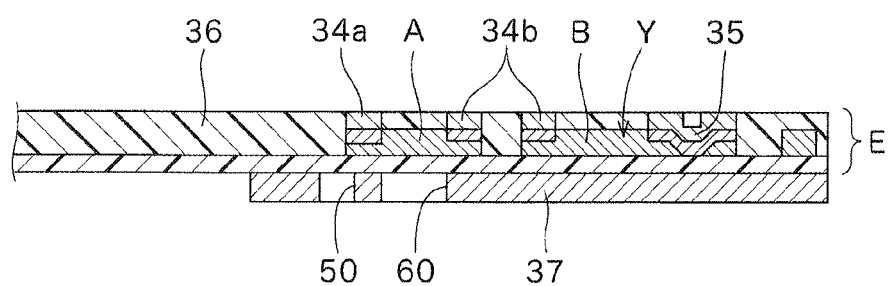
FIG. 5 is an illustration of a manufacturing step of the aforementioned opto-electric hybrid board.

Next, an etching process (dry film resist lamination, exposure, development, etching, dry film resist removal, and the like) is performed on the metal reinforcement layer 37 on the opposite side of the insulative layer 31 from the electric circuit part. E to remove an unnecessary portion, thereby forming a predetermined pattern shape. This provides the through hole 50 for optical coupling to the optical element 32 (with reference to FIG. 1), the opening 60 in the portion facing the interconnect line portions A, and other openings, as shown in FIG. 5.

(3) Formation of Optical Waveguide W

Next, the insulative layer 31 with the electric circuit part E and the metal reinforcement layer 37 is turned upside down, so that the metal reinforcement layer 37 faces upward. Then, the under cladding layer 40, the core 41, and the over cladding layer 42 are formed in a stacked manner by a known method on the surface of the insulative layer 31 on the side where the metal reinforcement layer 37 is formed, with each layer patterned into a predetermined pattern as required, whereby the optical waveguide W is obtained (with reference to FIG.).

While the optical coupling to the optical element 32 to be provided on the electric circuit part E side of the insulative layer 31 is assumed, a predetermined portion of the optical waveguide W is formed into an inclined surface inclined at 45 degrees with respect to a longitudinal direction of the core 41 by dicing, laser machining, cutting, or the like to provide the light reflecting portion 43. In this manner, the opto-electric hybrid board 30 shown in FIG. 1 is obtained. An optical connector for connection to other optical interconnect members may be attached to a tip side not shown opposite the side facing the electric circuit part E as seen in a longitudinal direction of the optical waveguide W. Alternatively, a similar electric circuit part E' may be formed on the tip side, with the optical waveguide W therebetween.

Figure 6:
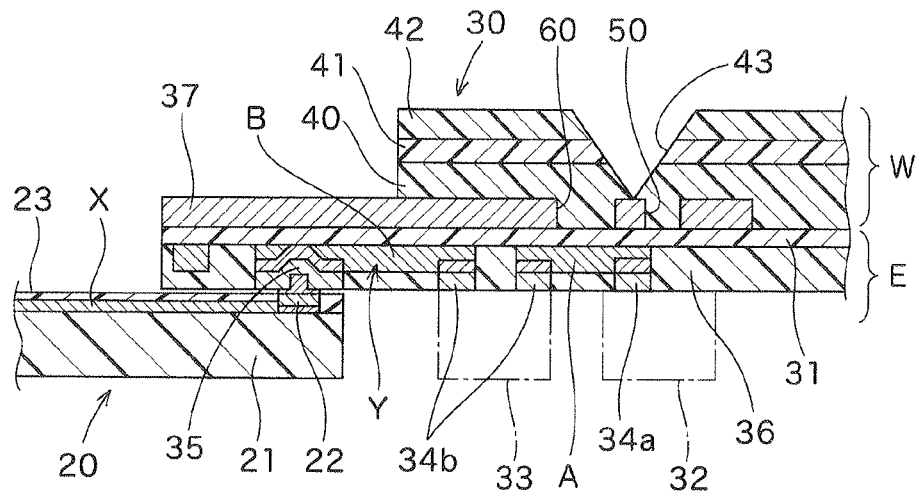
FIG. 6 is an illustration of a manufacturing step of an optical communication module using the aforementioned opto-electric hybrid board.

The opto-electric hybrid board 30 thus obtained is connected to a wiring board 20 for use in various electric and electronic devices, for example, as shown in FIG. 6 to become an optical communication module board. Then, necessary devices are mounted on this optical communication module board, whereby an optical communication module is provided. The wiring board 20 includes an insulative substrate 21, electrical interconnect lines X, connecting terminals 22, and a coverlay 23. The connection of the opto-electric hybrid board to the wiring board 20 is generally made by facing the connecting terminals 35 and 22 thereof in vertically stacked relation and then electrically connecting the faced connecting terminals 35 and 22 with solder bumps or the like.

In the opto-electric hybrid board 30, the portion facing the interconnect line portions A connecting the pads 34a for mounting the optical element 32 and the pads 34b for the driving device 33 is removed from the metal reinforcement layer 37 provided on the one surface of the insulative layer 31 to become the opening 60. This allows the removal of the capacitance generated between the interconnect line portions A where electricity flows and the metal reinforcement layer 37, in the vicinity of the optical element 32 to be mounted. For this reason, the effective capacitance of the optical element 32 does not increase even after the mounting on the opto-electric hybrid board 30, so that the frequency band of the optical element 32 is maintained at the frequency band prior to the mounting. In other words, the amount of transmissible signal information is increased without reducing the speed.

In addition, when the opening is provided in the coverlay 36 covering the interconnect line portions A to expose the interconnect line portions A connecting the optical element 32 and the driving device 33 in the opto-electric hybrid board 30, the effective capacitance of the optical element 32 is made smaller than that obtained when the opening is not provided.

The influence of the additional capacitance between the interconnect line portions A and the metal reinforcement layer 37 is more pronounced in the PD than in the VCSEL because the PD is smaller than the VCSEL in capacitance that the optical element 32 originally has. It is hence particularly effective to apply the present disclosure when the PD is used as the optical element 32.

In the aforementioned example, an opening dimension [indicated by J in FIG. 2B] of the opening 60 of the metal reinforcement layer 37 as measured in a longitudinal direction of the interconnect line portions A is set preferably in the range of 0.8 to 1 when a longitudinal dimension [indicated by H in FIG. 2A] (as measured in the direction in which the interconnect lines extend) of the interconnect line portions A provided on the opposite side of the insulative layer 31 therefrom is 1. If the opening dimension J of the opening 60 as measured in the longitudinal direction of the interconnect line portions A is longer than the longitudinal dimension H of the interconnect line portions A, a portion of the metal reinforcement layer 37 which overlaps the pads 34a and 34b is partially removed, so that the function as a reinforcing plate is decreased during the mounting of the optical element 32 and the driving device 33. This is undesirable because sufficient connection strength cannot be obtained in the mounting area and the reliability of the connection strength in this area is reduced during subsequent handling. The capacitance between the interconnect line portions A and the metal reinforcement layer 37 is proportional to the area of a portion where the interconnect line portions A and the metal reinforcement layer 37 face each other. For this reason, if the opening dimension J is too smaller than the aforementioned range, a non-negligible capacitance is generated in this portion. This is undesirable because the effective capacitance of the optical element 32 tends to increase, thereby causing the frequency band to make a transition to a lower frequency side.

Figure 7:
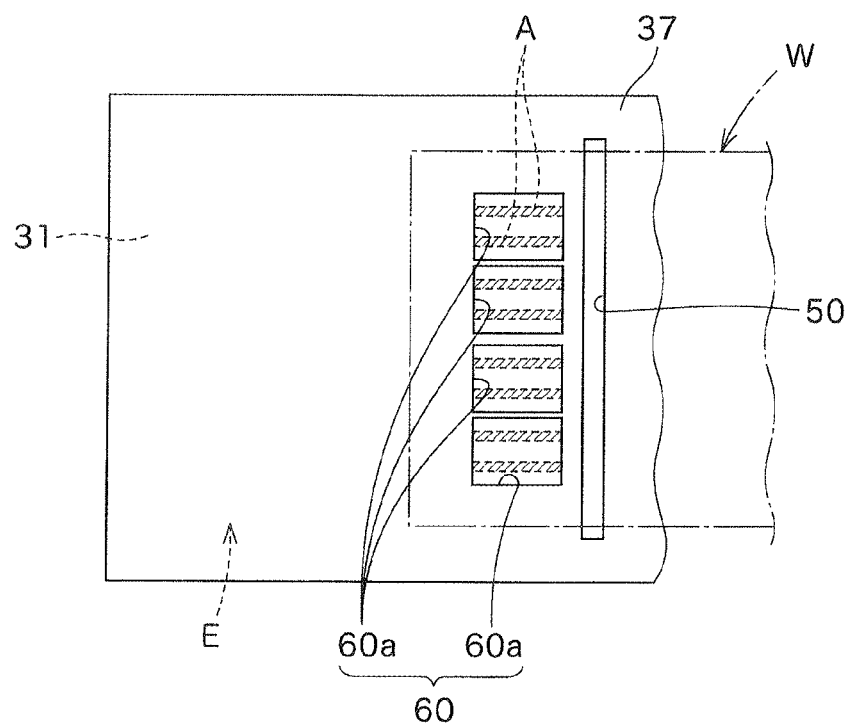
FIG. 7 is an illustration showing a modification of an opening of the metal reinforcement layer in the aforementioned opto-electric hybrid board.

In the aforementioned example, the opening 60 of the metal reinforcement layer 37 is formed as a single elongated opening collectively facing the interconnect line portions A including four pairs of interconnect lines corresponding to multiple channels arranged in parallel (with reference to FIG. 2A; corresponding to four channels in this example). However, the opening 60 may be multiple individual openings 60a (four openings 60a in this example), one for each of the channels, as shown in FIG. 7, for example. This configuration, in which portions of the metal reinforcement layer 37 remain as partitions between the channels, is inferior to the aforementioned example in terms of the effect of capacitance removal, but is advantageous in that the reinforcement effect during the mounting of the optical element 32 and the driving device 33 in the vicinity of the opening 60 is improved as compared with the aforementioned example.

In the aforementioned example, the opening 60 is provided in the portion facing the interconnect line portions A of the electric circuit part E as a removal portion of the metal reinforcement layer 37 for improvement in electrical properties. However, the metal reinforcement layer 37 may be provided with another removal portion, as appropriate, separately from the opening 60 to the extent that the reinforcement function thereof is not impaired. For example, the metal reinforcement layer 37 may be removed in a strip-shaped form along interconnect lines in a portion facing the interconnect line portions B (with reference to FIG. 2A) extending toward the connecting terminals 35. This configuration allows the frequency band of the interconnect line portions B which are differential electrical interconnect lines to be made higher in frequency.

In the aforementioned example, the types of signals flowing in the interconnect line portions A and the interconnect line portions B are not particularly limited, and appropriate signals are selected in accordance with the types of the optical element 32 and various devices to be connected. Examples of the signal types include single-ended signals, differential signals, and coplanar signals.

Next, an example will be described in conjunction with a comparative example. It should be noted that the present disclosure is not limited to the following example.

EXAMPLES

A test was conducted to verify what difference arose in capacitance of an optical element mounted on an opto-electric hybrid board between an instance in which an opening was formed in a portion of a metal reinforcement layer of the opto-electric hybrid board which faced the interconnect line portions A (with reference to FIG. 2A) on an electric circuit part side and in an instance in which the opening was not formed.

<Verification of Capacitance of Optical Element>

Measurement of Example Sample 1

Figure 8:
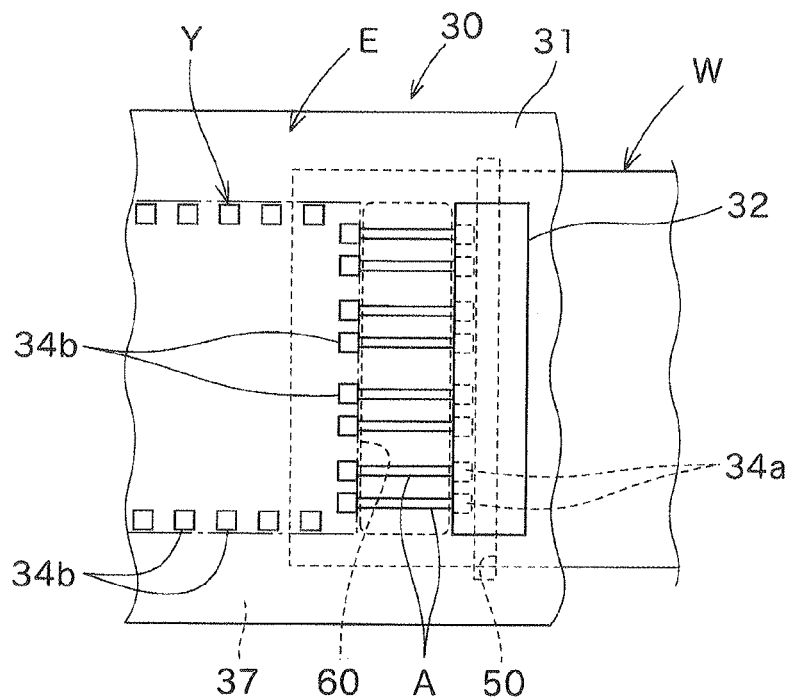
FIG. 8 is an illustration of a method of evaluating electrical properties in an example and a comparative example according to the present disclosure.

First, an opto-electric hybrid board shown in FIG. 8 similar to the opto-electric hybrid board 30 shown in FIGS. 1, 2A, and 2B was produced in accordance with the procedure described in the aforementioned embodiment. In the figures, the same components are designated by the same reference numerals and characters, and will not be described. In the electric circuit part E of the opto-electric hybrid board 30, a photodiode for 25 Gbps (product designation APA1201040000 available from II-VI Laser Enterprise GmbH) was mounted as the optical element 32 on the pads 34a for optical element mounting.

The capacitance of the optical element 32 at 1 MHz was measured while a reverse bias voltage of 2 V was applied to the optical element 32 by means of an impedance analyzer (product designation 4294A available from Keysight Technologies) from the pads 34b arranged at distal ends of the interconnect line portions A extending from the optical element 32. The result was 0.09 pF.

Measurement of Comparative Example Sample 1

A product (conventional product) was prepared in which the opening 60 was not provided in the metal reinforcement layer 37 in FIG. 8. The capacitance of the optical element 32 (the same photodiode as in Example Sample 1) at 1 MHz was measured in accordance with the same procedure as described above. The result was 0.14 pF.

The aforementioned results show that Example Sample 1 is smaller in capacitance than Comparative Example Sample 1.

Next, a test was conducted to verify what difference arose in frequency band of the optical element mounted on the opto-electric hybrid board between the instance in which the opening was formed in the portion of the metal reinforcement layer of the opto-electric hybrid board which faced the interconnect line portions A (with reference to FIG. 2A) on the electric circuit part side and in the instance in which the opening was not formed.
<Verification of Frequency Band of Optical Element>
[Measurement of S-Parameters]

A high-frequency optical signal outputted from a high-frequency light source with known S-parameters was inputted to Example Sample 1 or Comparative Example Sample 1 described above, and S-parameters were determined using a 2-port vector network analyzer (N5227A available from Keysight Technologies). Since the obtained S-parameters were a composite of the properties of the light source and Example Sample 1 or Comparative Example Sample 1, S-parameters of Example Sample 1 or Comparative Example Sample 1 were determined from the composite S-parameter values and the known S-parameter values of the light source.

For the aforementioned high-frequency light source, an opto-electric hybrid board similar in configuration to the opto-electric hybrid board 30 shown in FIGS. 1, 2A, and 2B was prepared, and a VCSEL for 25 Gbps (product designation APA4501040001 available from II-VI Laser Enterprise GmbH) was mounted as an optical element for the light source. A connector portion for optical transmission was formed at an end of the optical waveguide W extending from the opto-electric hybrid board. A high-frequency electric signal superimposed on a DC current of 6 mA was inputted from the pads 34b arranged at distal ends of the interconnect line portions A extending from the VCSEL (for the light source). This electric signal was converted into an optical signal by the aforementioned VCSEL (for the light source), and this was used as the light source.

Evaluation of Example Sample 1

A connector portion for optical transmission was formed at the end of the optical waveguide W of Example Sample 1, and the aforementioned connector portion was connected to the connector portion of the opto-electric hybrid board used as the aforementioned light source so that the optical signal inputted from the light source through the optical waveguide W was converted into an electric signal by the photodiode (the optical element 32) of Example Sample S-parameters were determined by the network analyzer while a DC reverse bias voltage of 2 V was applied from the pads 34b arranged at distal ends of the interconnect line portions A extending from the photodiode (the optical element 32) of Example Sample 1 described above.

The insertion loss of the S-parameters was determined using the insertion loss of the obtained S-parameters and the insertion loss of the known S-parameters of the light source. The normalized S-parameter insertion loss [response (dB)] of Example Sample 1 is shown in FIG. 9.

Evaluation of Comparative Example Sample 1

The same procedure as described above was used to determine the insertion loss of the S-parameters of Comparative Example Sample 1. The normalized S-parameter insertion loss of Comparative Example Sample 1 is also shown in FIG. 9.

Figure 9:
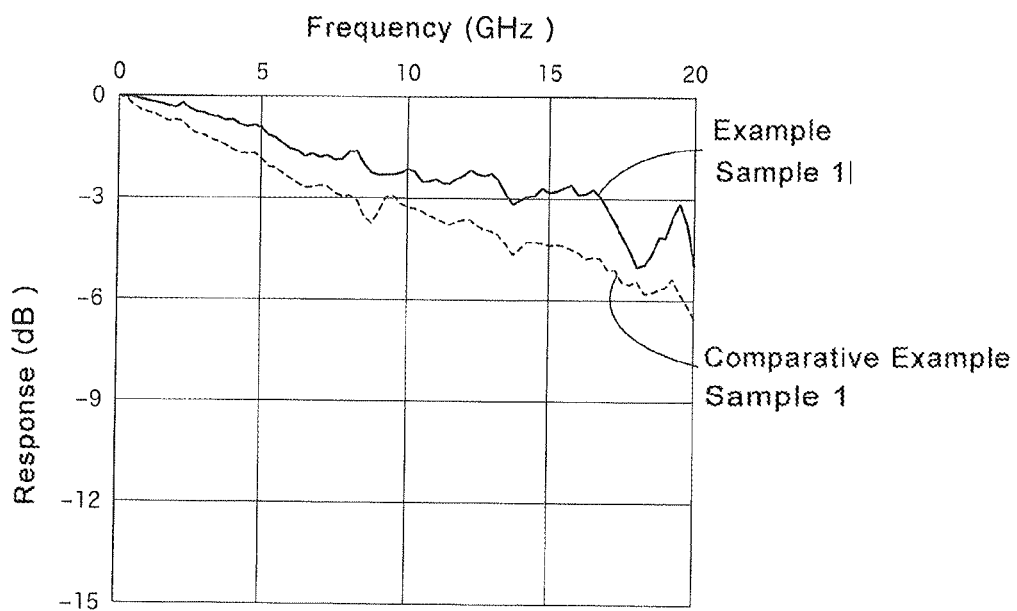
FIG. 9 is graph showing characteristic curves indicating the insertion loss of S-parameters in an example sample and a comparative example sample obtained by the aforementioned evaluation method.
Figure 10:
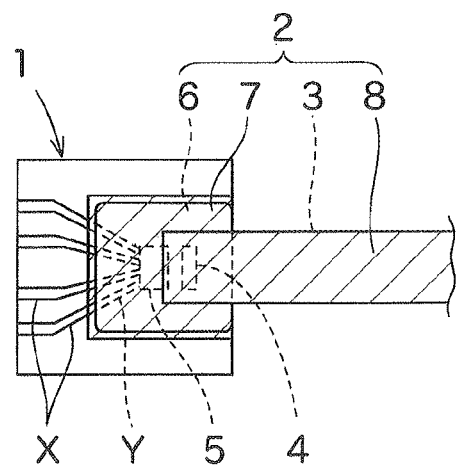
FIG. 10 is a schematic partial illustration showing an example of a general optical communication module.
Figure 11:
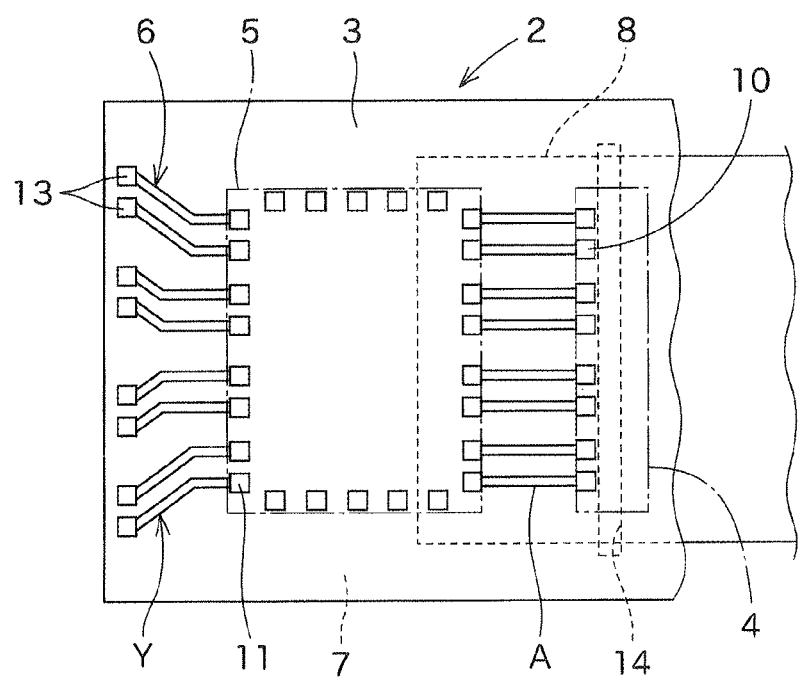
FIG. 11 is a schematic illustration illustrating an electric circuit part in an opto-electric hybrid board for use in the aforementioned optical communication module.

A comparison of frequency bands until the S-parameter insertion loss decreases by 3 dB in FIG. 9 shows that Example Sample 1 exhibits a higher frequency band above 5 GHz than Comparative Example Sample 1.

Thus, when the opto-electric hybrid board having a structure of Example Sample 1 described above is used in an actual optical communication module, it is found that the opto-electric hybrid board has excellent properties adaptable to the increase in communication information and in speed.

Although specific forms in the present disclosure have been described in the aforementioned examples, the aforementioned examples should be considered as merely illustrative and not restrictive, it is contemplated that various modifications evident to those skilled in the art could be made without departing from the scope of the present disclosure.

The opto-electric hybrid board of the present disclosure allows the optical element mounted on the board to maintain a low capacitance that the optical element originally has without being affected by the presence of the metal reinforcement layer on the back surface side. Therefore, the opto-electric hybrid board is capable of providing a higher frequency of transmission signals than that in the conventional techniques, and is widely usable in high-speed signal transmission techniques.

REFERENCE SIGNS LIST

30 Opto-electric hybrid board
31 Insulative layer
32 Optical element

33 Driving device
34a, 34b Pads
37 Metal reinforcement layer
60 Opening
A Interconnect line portions
E Electric circuit part
W Optical waveguide
Y Electrical interconnect lines

The invention claimed is:

1. An opto-electric hybrid board for use in an optical communication module, comprising:
an insulative layer;
an electric circuit part provided on a first surface side of the insulative layer, the electric circuit part including a pad for mounting an optical element, a pad for an optical element driving device, and an electrical interconnect line Y including an interconnect line portion A connecting the pads;
a metal reinforcement layer provided on a second surface side of the insulative layer; and
an optical waveguide provided similarly on the second surface side of the insulative layer, with a portion thereof in an arrangement that partially overlaps the metal reinforcement layer,
wherein a portion of the metal reinforcement layer which faces the interconnect line portion A provided on the opposite side of the insulative layer therefrom is removed to form an opening, and
wherein an opening dimension of the opening of the metal reinforcement layer as measured in a longitudinal direction of the interconnect line portion A is set to 0.8 to 1 when a longitudinal dimension of the interconnect line portion A is 1.

2. The opto-electric hybrid board according to claim 1, wherein the optical element is a photodiode.

* * * * *